(12) United States Patent
Loechelt et al.

(10) Patent No.: US 7,768,078 B2
(45) Date of Patent: Aug. 3, 2010

(54) POWER SEMICONDUCTOR DEVICE HAVING IMPROVED PERFORMANCE AND METHOD

(75) Inventors: Gary H. Loechelt, Tempe, AZ (US); Peter J. Zdebel, Austin, TX (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 198 days.

(21) Appl. No.: 12/236,947

(22) Filed: Sep. 24, 2008

(65) Prior Publication Data
US 2009/0014814 A1    Jan. 15, 2009

Related U.S. Application Data

(62) Division of application No. 11/112,597, filed on Apr. 25, 2005, now Pat. No. 7,446,354.

(51) Int. Cl.
*H01L 27/088*    (2006.01)

(52) U.S. Cl. .................. 257/408; 257/900; 257/341; 257/401; 438/197; 438/140

(58) Field of Classification Search .......... 257/E29.263, 257/E29.13, E21.676, 341, 900, 401, 408; 438/197, 140
See application file for complete search history.

(56) References Cited

U.S. PATENT DOCUMENTS

| | | | |
|---|---|---|---|
| 6,869,847 B2 * | 3/2005 | Mori | 438/286 |
| 6,906,381 B2 * | 6/2005 | Peyre-Lavigne et al. | 257/333 |
| 7,262,476 B2 * | 8/2007 | Bude et al. | 257/493 |

* cited by examiner

*Primary Examiner*—Thao X Le
*Assistant Examiner*—Thanh Y Tran
(74) *Attorney, Agent, or Firm*—Kevin B. Jackson

(57) ABSTRACT

In one embodiment, a semiconductor device is formed in a body of semiconductor material. The semiconductor device includes a counter-doped drain region spaced apart from a channel region.

18 Claims, 8 Drawing Sheets

POWER SEMICONDUCTOR DEVICE HAVING IMPROVED PERFORMANCE AND METHOD

This application is a divisional application of U.S. application Ser. No. 11/112,597 now U.S. Pat. No. 7,446,354 filed on Apr. 25, 2005 by common inventors Gary H. Loechelt et al. and assigned to common assignee Semiconductor Components Industries LLC.

FIELD OF THE INVENTION

This invention relates generally to semiconductor devices, and more specifically to power switching devices including high speed devices such as RF amplifiers and methods of their manufacture.

BACKGROUND OF THE INVENTION

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In optimizing the performance of MOSFET devices, designers often are faced with trade-offs in device parameter performance. Specifically, available device structure or fabrication process choices may improve one device parameter, but at the same time such choices may degrade one or more other device parameters. For example, available structures and processes that improve the output or drive current ($I_{DS}$) capability and on resistance of a MOSFET device also degrade its breakdown voltage ($BV_{DSS}$) capability and increase gate to drain capacitance.

Accordingly, improved semiconductor device structures and methods of their manufacture are needed to address the above mentioned issues as well as others.

DETAILED DESCRIPTION OF THE DRAWINGS

Figure 1:
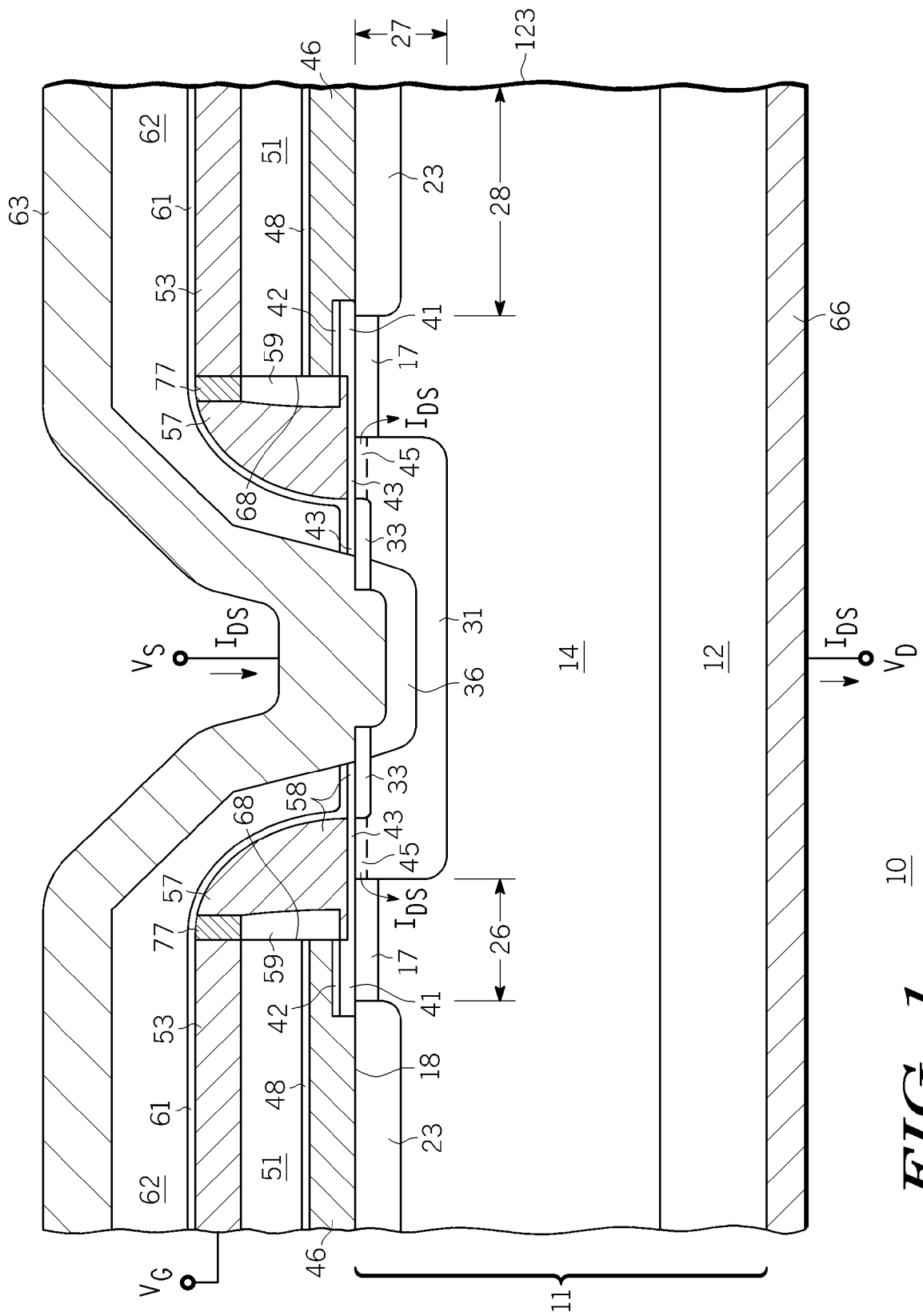
FIG. 1 illustrates a highly enlarged partial cross-sectional view of a semiconductor structure in accordance with an embodiment of the present invention.

For ease of understanding, elements in the drawing figures are not necessarily drawn to scale, and like element numbers are used where appropriate throughout the various figures. While the discussion below describes an n-channel device, the invention also pertains to p-channel devices, which may be formed by reversing the conductivity type of the described layers and regions.

In addition, the device of the present invention may embody either a cellular design (where the body regions are a plurality of cellular regions) or a single body design (where the body region is comprised of a single region formed in an elongated pattern, typically in a serpentine pattern). However, the device of the present invention will be described as a cellular design throughout the description for ease of understanding. It should be understood that it is intended that the present invention encompass both a cellular design and a single base design.

FIG. 1 shows an enlarged partial cross-sectional view of an insulated gate field effect transistor (IGFET), MOSFET, power transistor, or switching device or cell 10 in accordance with an embodiment of the present invention. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises for example, an n-type silicon substrate 12 having a resistivity in range of approximately 0.001 to about 0.005 ohm-cm, and may be doped with arsenic. In the embodiment shown, substrate 12 provides a drain contact or a first current carrying contact. A semiconductor layer or extended drain region 14 is formed in or on substrate 12. In one embodiment, semiconductor layer 14 is formed using conventional epitaxial growth techniques. Alternatively, semiconductor layer 14 is formed using conventional doping and diffusion techniques. In an embodiment suitable for a 50 volt device, semiconductor layer 14 is n-type with a dopant concentration of about $1.0 \times 10^{15}$ atoms/cm$^3$, and has a thickness on the order of about 3 to about 5 microns. The thickness and dopant concentration of semiconductor layer 14 is increased or decreased depending on the desired $BV_{DSS}$ rating of device 10. It is understood that other materials may be used for body of semiconductor material 11 or portions thereof including silicon—germanium, silicon—germanium—carbon, carbon doped silicon, silicon carbide, or the like. Additionally, in an alternate embodiment, the conductivity type of substrate 12 is switched to be opposite the conductivity type of semiconductor layer 14 to form an insulated gate bipolar transistor 10.

Device 10 also includes an n-type region or blanket layer 17 formed in or adjacent to upper or major surface 18 of region of semiconductor material 11. N-type region 17 provides a low resistance current path for device 10. In an exemplary embodiment, n-type region 17 has a maximum concentration on the order of about $6.0\times10^{16}$ atoms/cm$^3$, and a depth of about 0.4 microns.

A body, base, or doped region 31 is formed in semiconductor layer 14 and extends from major surface 18. By way of example, body region 31 comprises p-type conductivity, and has a dopant concentration suitable for forming an inversion layer that operates as conduction channels 45 of device 10. Body region 31 extends from major surface 18 to a depth, for example, of about 0.5 microns to about 3.0 microns. An n-type source region, current conducting, or current carrying region 33 is formed within or in body region 31 and extends from major surface 18 to a depth, for example, of about 0.1 microns to about 0.5 microns. A p-type body contact or contact region 36 is also formed in body region 31, and provides a lower contact resistance to body region 31 at major surface 18. In addition, contact region 36 lowers the sheet resistance of body region 31 under source region 33, which suppresses parasitic bipolar effects.

A first dielectric layer 41 is formed over or adjoining portions of major surface 18. For example, dielectric layer 41 comprises a thermal oxide layer having a thickness of about 0.05 microns to about 0.2 microns. A second dielectric layer 42 is formed over dielectric layer 41. In one embodiment, second dielectric layer 42 comprises silicon nitride, and has a thickness of about 0.05 microns to about 0.1 microns.

Gate dielectric layers 43 are formed over or adjoining other portions of major surface 18 adjacent to body region 31. Gate dielectric layers 43 comprise for example, silicon oxide, and have a thickness of about 0.01 microns to about 0.1 microns. In alternative embodiments, gate dielectric layers 43 comprise silicon nitride, tantalum pentoxide, titanium dioxide, barium strontium titanate, or combinations thereof including combinations with silicon oxide, or the like.

Conductive spacer gate regions, vertical spacer gate regions, or spacer defined gate regions or conductive electrodes 57 are formed over gate dielectric layers 43, and are isolated from conductive layers 46 by dielectric spacers 59. Conductive spacer gate regions 57 together with gate dielectric layers 43 form a control electrode or gate structure 58. Conductive spacer gate regions 57 comprise, for example, n-type polycrystalline silicon or polysilicon, and are about 0.2 microns to about 0.8 microns in thickness. In an exemplary embodiment, dielectric spacers 59 comprise silicon nitride, and are about 0.1 microns in thickness. Spacer gate regions 57 are coupled to conductive layer 53 to provide a conductive gate structure, which controls the formation of channels 45 and the conduction of current in device 10. In the embodiment shown, a conductive connective portion 77 couples spacer gate regions 57 to conductive layers 53. Conductive connective portions 77 comprise for example, n-type polysilicon. A spacer defined gate region refers to a control electrode formed with gate material deposited on one surface to control a channel formed on another perpendicular surface. In the case of device 10, channels 45 are formed at major surface 18, which is considered a horizontal surface. The control electrode film used to form spacer gate regions 57 is deposited along vertical surfaces 68, which are perpendicular to surface 18.

Conductive spacer gate regions 57 provide a minimal gate to drain overlap compared to conventional devices, thereby significantly reducing gate charge. Additionally, in device 10 the electrical routing for the gate is provided by conductive layer 53, which is elevated above major surface 18 thereby further reducing gate charge. Further, conductive layer 46 (described below) functions, among other things, as a ground plane or shield layer interposed between the gate and drain regions to further reduce gate to drain capacitance. These features provide enhanced switching speed and reduced input charge requirements.

In accordance with the present invention, conductive layer or doped polycrystalline semiconductor layer 46 is formed over dielectric layers 41 and 42, and coupled to a doped region or counter-doped drain region 23 formed in body of semiconductor material 11. In an exemplary embodiment, conductive layer 46 comprises a polysilicon layer, has a thickness of about 0.1 microns, and has p-type conductivity for an n-channel device. When heat treated, p-type dopant from conductive layer 46 diffuses into body of semiconductor material 11 to form doped regions 23. In an alternative embodiment, doped regions 23 are formed using ion implantation techniques. In an alternative embodiment, conductive layer 46 comprises amorphous silicon, a metal, a silicide, or combinations thereof including combinations with polysilicon. If a metal is used for conductive layer 46, p-type dopant is first implanted or deposited into body of semiconductor material 11 to form doped regions 23. Conductive layer 46 is left floating or is coupled to a fixed potential such as $V_S$ or ground.

In accordance with the present invention, doped regions 23 are spaced a distance 26 that is on the same order as the body region 31 to drain junction depth 27. In one embodiment, doped regions 23 are spaced a distance 26 from about 0.5 microns to about 3.0 microns from body region 31. In one embodiment, doped regions 23 are placed in a portion of semiconductor layer 14 that is not exposed to a high current flux to avoid impacting drain current characteristics. In a further embodiment, doped regions 23 are spaced a distance 28 from a central line 123 located at a midpoint of doped regions 23. By way of example, distance 28 is in a range from about 0.25 microns to about 0.8 microns.

A fifth dielectric layer 61 is formed over portions of device 10, and comprises for example, silicon nitride having thickness of about 0.05 microns. An interlayer dielectric (ILD) layer 62 is formed over portions of device 10, and comprises for example, a deposited silicon oxide having a thickness of about 0.8 microns. An opening is formed in the dielectric layers to provide a contact to device 10 for source contact layer 63. As shown, a portion of major surface 18 is etched so that source contact layer 63 makes contact to both source regions 33 and body region 36. In one embodiment, source contact layer 63 comprises an aluminum silicon alloy or the like. A drain contact layer or conduction electrode 66 is formed on an opposing surface of region of semiconductor material 11, and comprises, for example, a solderable metal structure such a titanium-nickel-silver, chrome-nickel-gold, or the like.

The operation of device 10 proceeds as follows. Assume that source or input terminal 63 is operating at a potential $V_S$ of zero volts, spacer gate regions 57 receive a control voltage $V_G$=2.5 volts, which is greater than the conduction threshold of device 10, and drain or output terminal 66 operates at drain potential $V_D$=5.0 volts. The values of $V_G$ and $V_S$ cause body region 31 to invert under spacer gate regions 57 to form channels 45, which electrically connect source regions 33 to layer 17. A device current $I_{DS}$ flows from source terminal 63 and is routed through source regions 33, channels 45, layer 17, and semiconductor layer 14 to drain terminal 66. In one embodiment, $I_{DS}$=1.0 amperes. To switch device 10 to the off state, a control voltage $V_G$ of less than the conduction threshold of device is applied to spacer gates 57 (e.g., $V_G$<2.5 volts). This removes channels 45 and $I_{DS}$ no longer flows through device 10.

In accordance with the present invention, doped regions 23 function to improve the planarity of the electric field formed in drain region or semiconductor layer 14, and further reduce depletion region charge induced in body region 31 by a high drain voltage. This increases the breakdown voltage of device 10.

Figure 2:
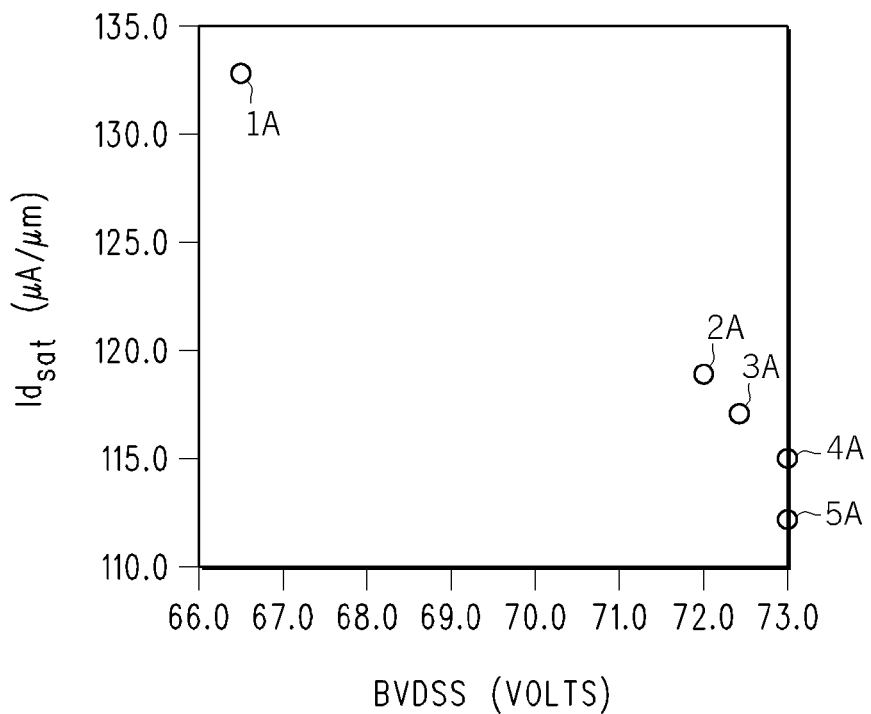
FIG. 2 is a graph showing drain saturation current ($I_{DSat}$) as a function of breakdown voltage ($BV_{DSS}$) for various embodiments of the present invention.

FIG. 2 is a graph showing drain current $I_{DSat}$ performance for device 10 as function of breakdown voltage ($BV_{DSS}$) under a bias $V_{GS}$ of 5.0 volts, and with conductive layer 46 tied to $V_S$. FIG. 2 further depicts $I_{DSat}$ as a function of various distances 28 (shown in FIG. 1) for doped regions 23 as follows: data point 1A corresponds to no doped region 23, point 2A corresponds to a distance 28 on the order of 0.5 microns, point 3A corresponds to a distance 28 on the order of 0.6 microns, point 4A corresponds to a distance 28 on the order of 0.7 microns, point 5A corresponds to a distance 28 on the order of 0.8 microns. As shown in FIG. 2, doped regions 23 improve breakdown voltage performance without significantly impacting $I_{DSat}$ performance.

Figure 3:
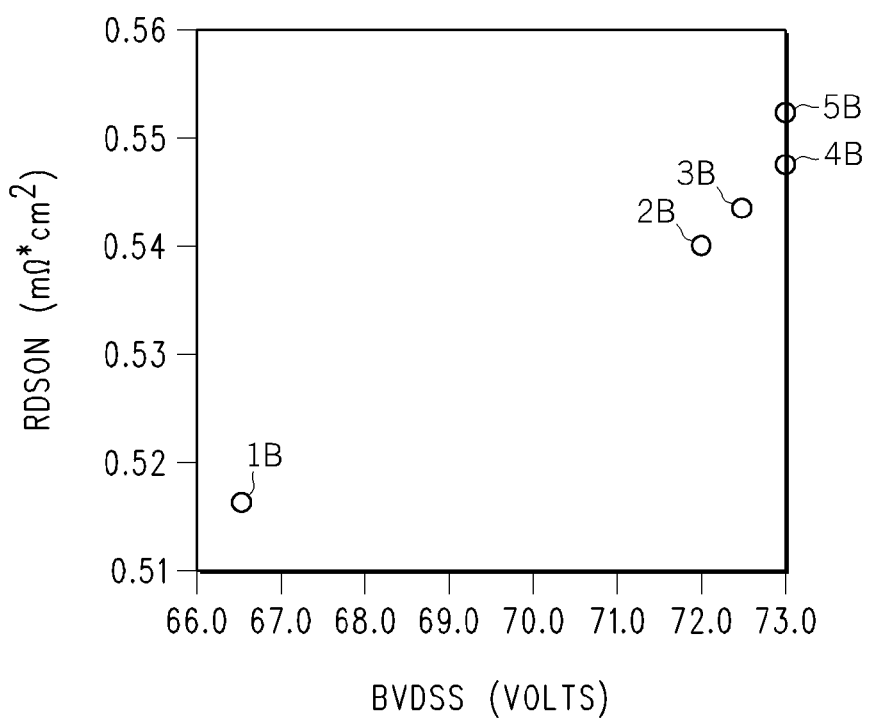
FIG. 3 is a graph showing on-resistance ($R_{DSON}$) and $BV_{DSS}$ performance for various embodiments of the present invention.

FIG. 3 is a graph showing drain resistance in the on-state (Rdson) as a function of breakdown voltage ($BV_{DSS}$) under a $V_{GS}$ bias of 5.0 volts, and with conductive layer 46 tied to $V_S$. FIG. 3 further depicts Rdson performance as a function of distances 28 for doped regions 23. Data points 1B-5B correspond to the same distances 28 as points 1A-5A set forth in the description of FIG. 2. As shown in FIG. 3, doped regions 23 improve the breakdown voltage of device 10 without significantly impacting drain resistance in the on-state.

Figure 4:
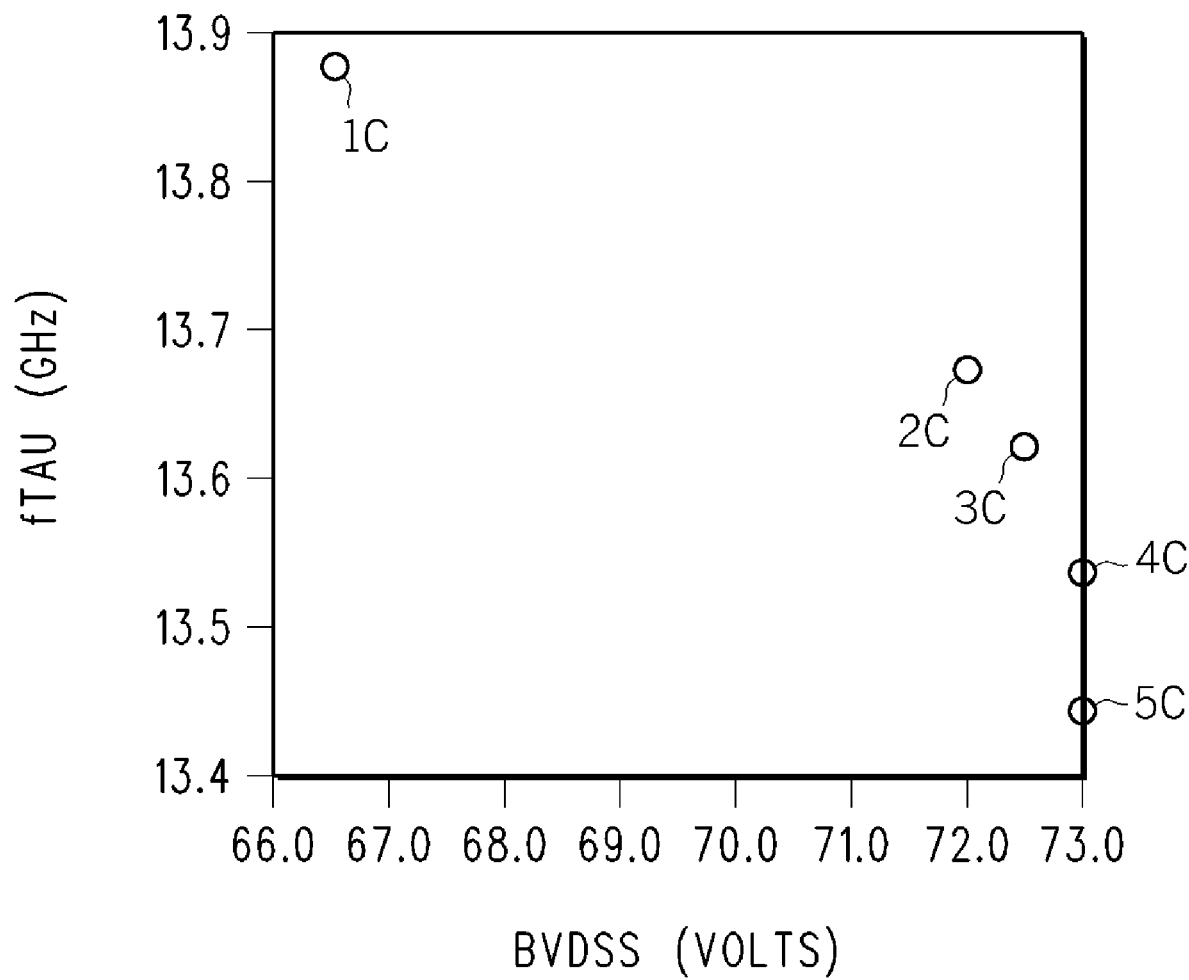
FIG. 4 is a graph showing a correlation between $BV_{DSS}$ and frequency of unity current gain (fTau)
Figure 5:
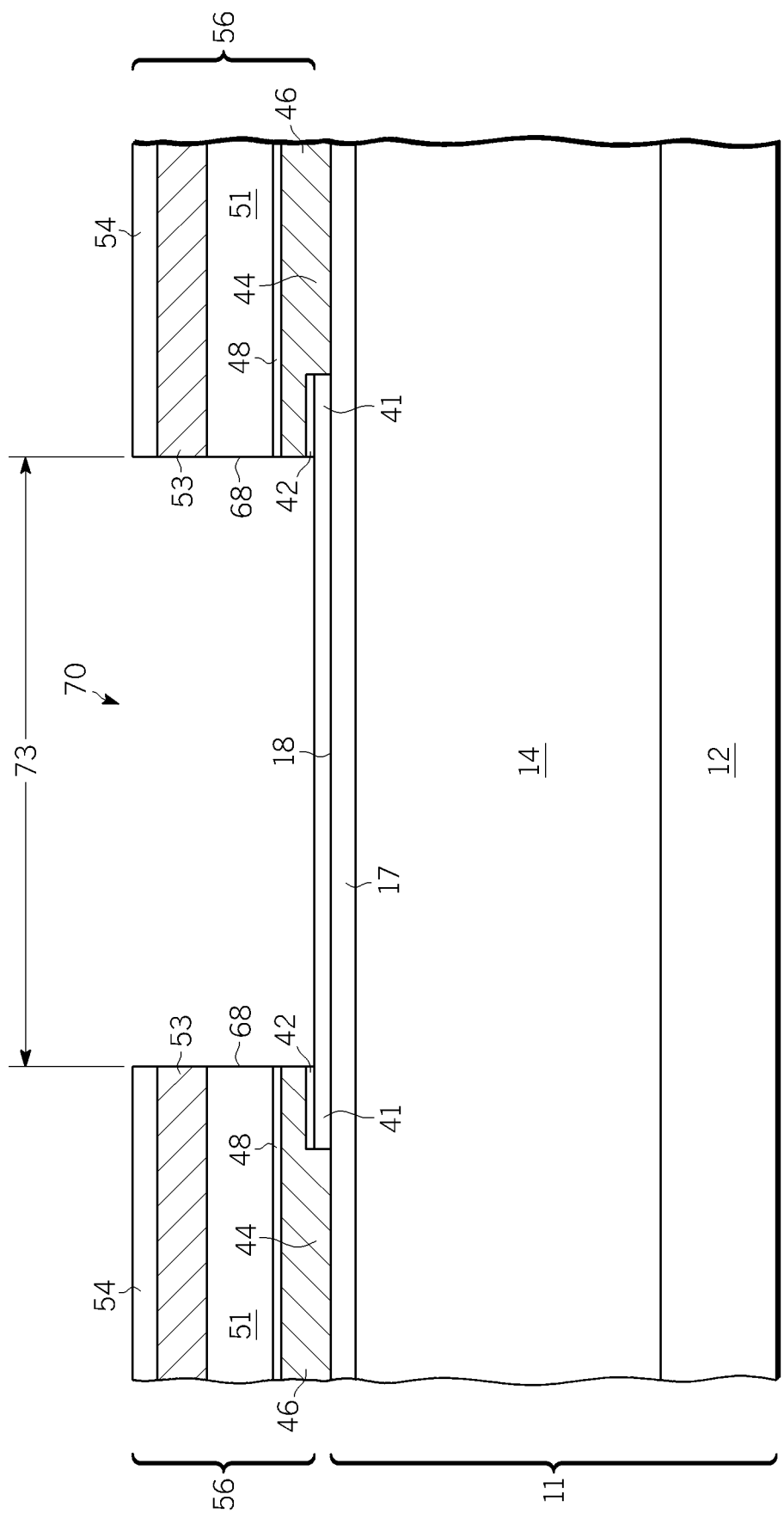
FIG. 5 illustrates a highly enlarged partial cross-sectional view of an embodiment of the present invention at an early stage of fabrication.

FIG. 4 is a graph showing frequency of unity current gain (fTau) as a function of breakdown voltage ($BV_{DSS}$) under a $V_{DS}$ bias of 30.0 volts, a VGS of 2.0 volts, and with conductive layer 46 tied to $V_S$. FIG. 4 further depicts fTau performance as a function of widths 28 for doped regions 23. Data points 1C-5C correspond to the same distances 28 as points 1A-5A set forth in the description of FIG. 2. As shown in FIG. 4, doped regions 23 improve the breakdown voltage of device 10 without significantly impacting the frequency of unity current gain.

Turning now to FIGS. 5-9, a process for forming device 10 in accordance with the present invention is described. FIG. 4 shows an enlarged partial cross-sectional view of device 10 at an early stage of fabrication. First dielectric layer 41 is formed over major surface 18, and comprises for example, a silicon oxide about 0.05 microns to about 0.2 microns thick. A thermal oxide grown at about 900 degrees Celsius is suitable. Next, second dielectric layer 42 is formed over dielectric 41, and comprises, for example, about 0.05 microns to about 0.1 microns of silicon nitride. Openings 44 are then formed in portions of dielectric layers 41 and 42 to expose portions of major surface 18. Openings 44 are formed using conventional photolithography and etch techniques.

Conductive layer 46 is then formed over second dielectric layer 42 and in openings 44 so that portions of conductive layer 46 are adjacent to major surface 18. When device 10 comprises an n-channel device, conductive layer 46 comprises about 0.1 microns of p-type polysilicon, and is either deposited doped or undoped. If conductive layer 46 is deposited initially undoped, conductive layer 46 is subsequently doped using, for example, ion implantation techniques. In one embodiment, conductive layer 46 is doped with a boron ion implant. A dose of about $5.0 \times 10^{15}$ to about $1.0 \times 10^{16}$ atoms/cm$^2$ with an implant energy of about 30 KeV is sufficient for doping conductive layer 46. In one embodiment, the boron dopant in conductive layer 46 will be diffused from conductive layer 46 into body of semiconductor material 11 to form doped regions 23. In an alternative embodiment, p-type dopant is ion implanted or deposited in openings 44 before conductive layer 46 is deposited.

Next, third dielectric layer 48 is formed over conductive layer 46, and fourth dielectric layer 51 is formed over third dielectric layer 48. Third dielectric layer 48 comprises, for example, silicon nitride (e.g., about 0.05 microns in thickness), and dielectric layer 51 comprises a deposited oxide (e.g., about 0.7 microns in thickness). Conductive layer 53 is then formed over fourth dielectric layer 51, and comprises for example, n-type polysilicon (e.g., about 0.3 microns in thickness). A protective layer 54 is formed over conductive layer 53, and comprises for example, about 0.15 microns of silicon nitride.

A photolithographic and etch step is done to etch through portions of layers 54, 53, 51, 48, 46 and 42 to provide an opening 70. This also forms pedestal stack structures 56, which are comprised of remaining portions of layers 42, 46, 48, 51, 53 and 54. In one embodiment, opening 70 has a width 73 on the order of about 5.0 microns to about 8.0 microns.

Figure 6:
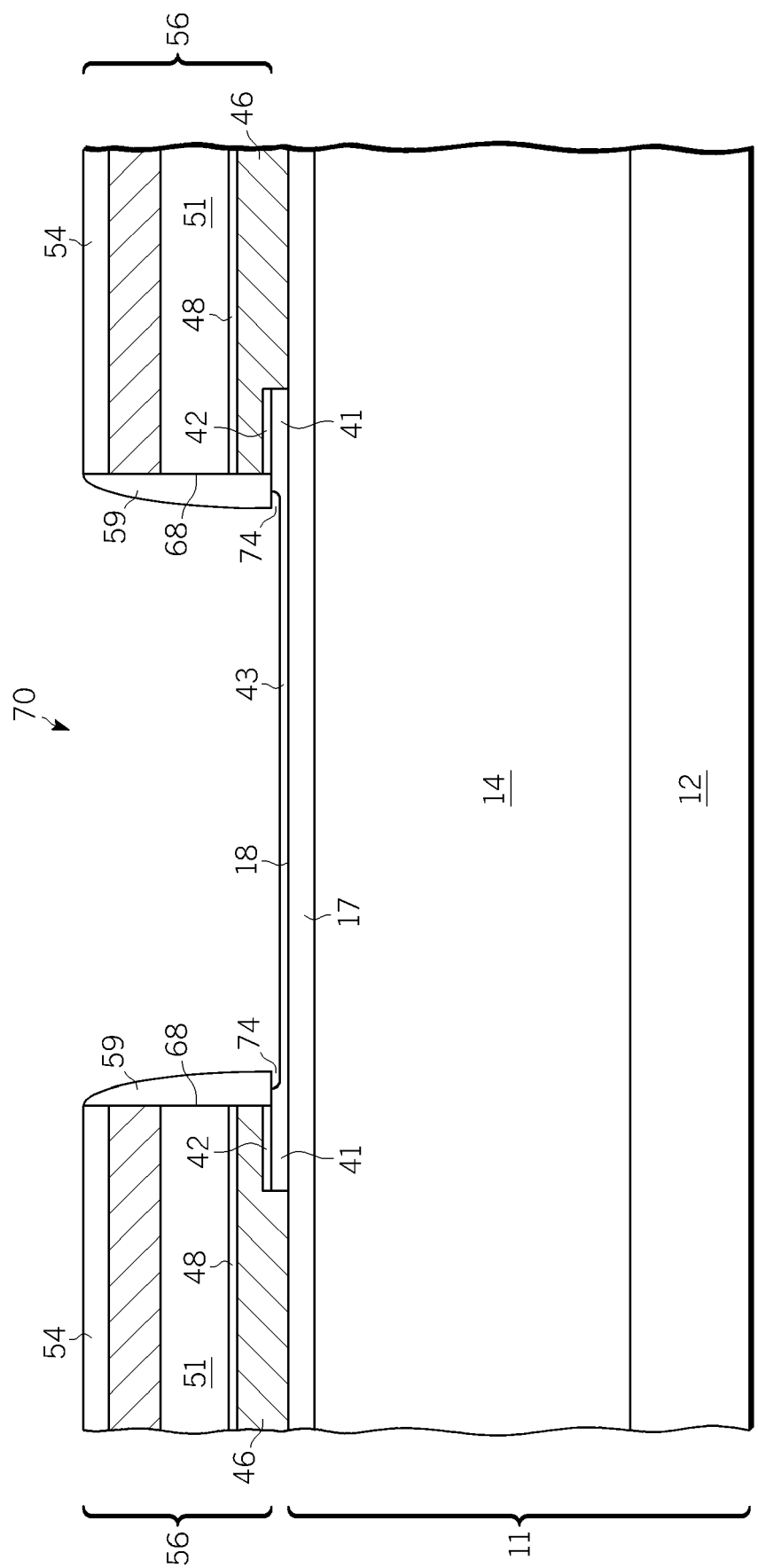
FIG. 6 illustrates a highly enlarged partial cross-sectional view of an embodiment of the present invention at a later stage of fabrication.

FIG. 6 shows an enlarged partial cross-sectional view of device 10 after additional processing steps that form dielectric spacers 59. In one embodiment, a silicon nitride film is deposited over pedestal stack structures 56 and first dielectric layer 41. By way of example, a silicon nitride film about 0.1 microns thick is deposited using chemical vapor deposition techniques. Next, a conventional anisotropic etch back step is used to remove portions of the silicon nitride layer over pedestal stack structures 56 and first dielectric layer 41 while leaving portions of the silicon nitride layer on sidewalls or vertical surfaces 68 to form dielectric spacers 59.

In a further step, a silicon oxide wet etch is then used to remove portions of dielectric layer 41 within opening 70. By way of example, a diluted hydrofluoric acid (e.g., 50:1) is used to etch dielectric layer 41. In an exemplary embodiment, the etch time is prolonged (e.g., 8 to 15 minutes) in order to undercut or remove material from dielectric layer 41 from beneath dielectric spacers 59 to form recessed portions 74. Recessing dielectric layer 41 in this manner ensures that channels 45 (shown in FIG. 1) formed in body region 31 extend into semiconductor layer 14 to allow channel current to flow more efficiently. In an exemplary embodiment, portions 74 are recessed under dielectric spacers 59 a distance of less than about 0.1 microns. A thermal silicon oxide is then grown on major surface 18 within opening 70 to a thickness of about 0.0125 microns to form gate dielectric layer 43.

Figure 7:
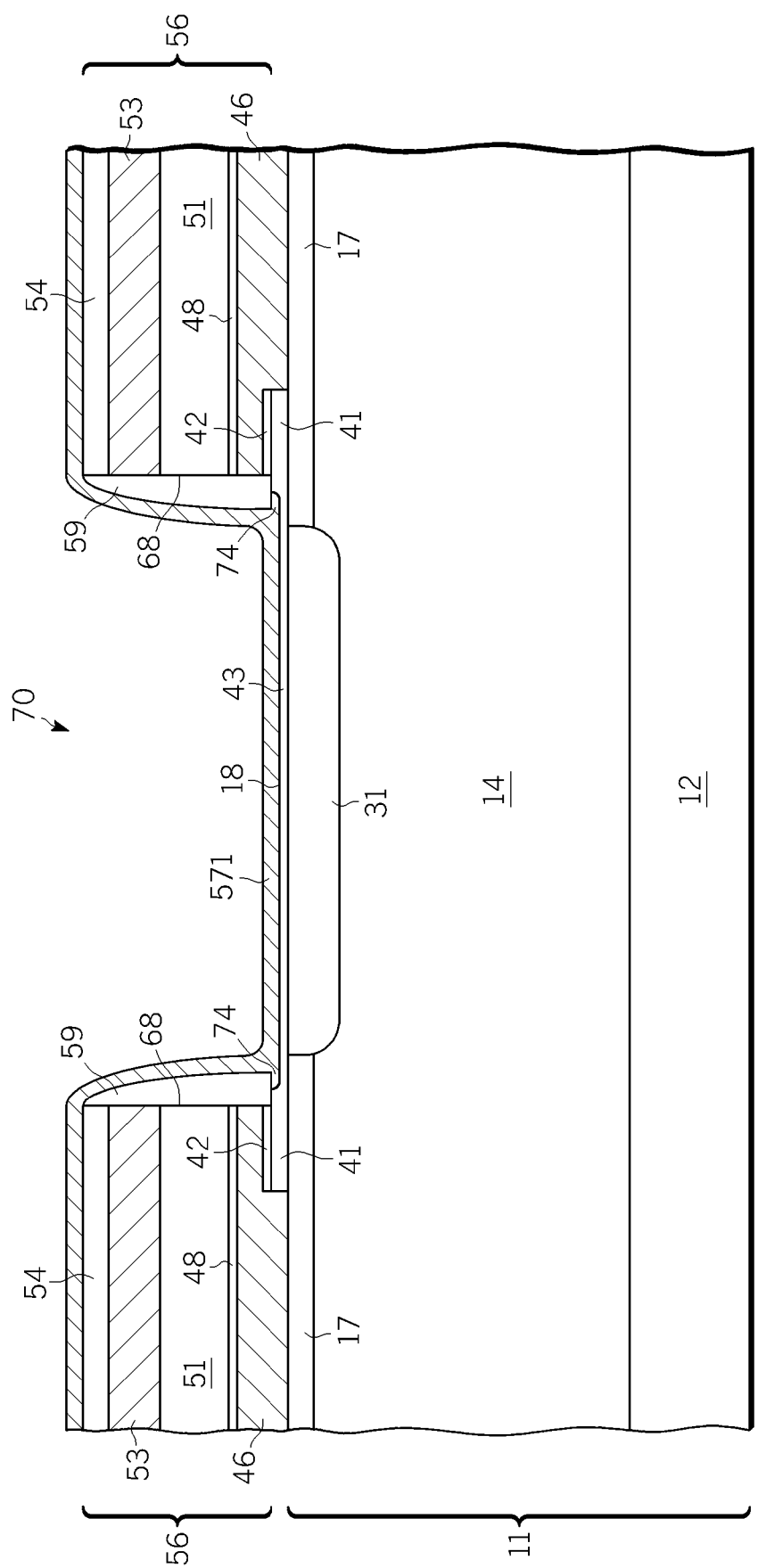
FIG. 7 illustrates a highly enlarged partial cross-sectional view of an embodiment of the present invention at a still later stage of fabrication.

FIG. 7 shows an enlarged partial cross-sectional view of device 10 after additional processing. A conformal layer of semiconductor material 571 is deposited over device 10 to a thickness of about 0.1 microns to about 0.15 microns. Boron dopant is then introduced through opening 70 and conformal layer of semiconductor material 571 into major surface 18 to provide p-type dopant for body region 31. By way of example, conformal layer of semiconductor material 571 comprises undoped polysilicon, and the boron is implanted through the undoped polysilicon into semiconductor layer 14. An ion implant dose of about $1.0 \times 10^{13}$ atoms/cm$^2$ and an implant energy of about 120 KeV is suitable for a 50 volt device.

Figure 8:
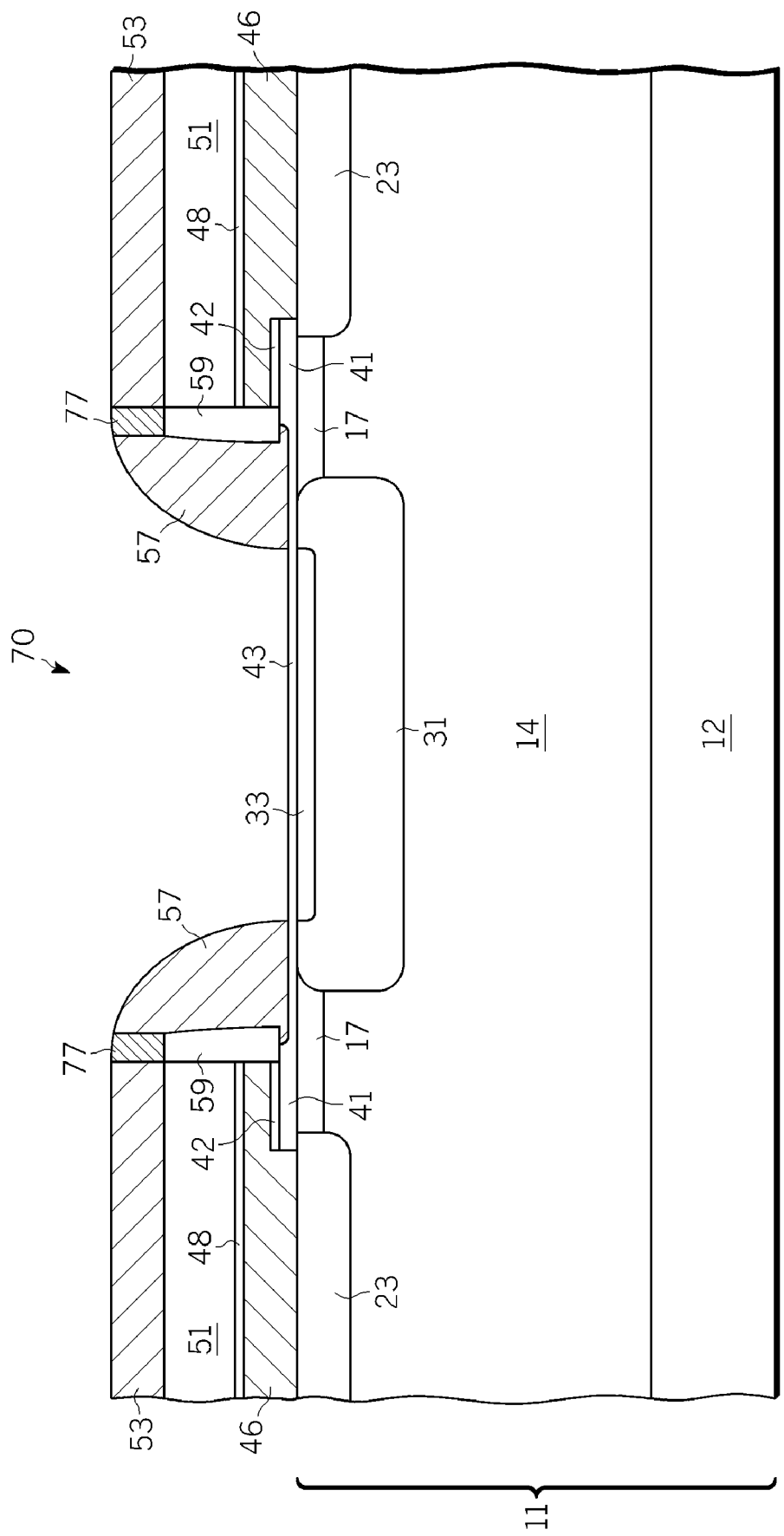
FIG. 8 illustrates a highly enlarged partial cross-sectional view of an embodiment of the present invention at a further stage of fabrication.

FIG. 8 shows an enlarged partial cross-sectional view of device 10 after further processing. A second conformal layer of semiconductor material is then deposited over conformal layer of semiconductor material 571 and both layers are etched to provide spacer gates 57. By way of example, the second conformal layer of semiconductor material comprises about 0.2 microns of n-type polysilicon, which may be doped during the deposition process or doped subsequently using ion implantation or other doping techniques. After spacer gates 57 are formed, an additional 0.015 microns of gate dielectric (e.g., silicon oxide) is added to the surface of spacer gates 57 and exposed portions of gate oxide 43.

In one embodiment, the etch step that forms spacer gates 57 also exposes protective layer 54 and the upper portions of dielectric spacers 59. Protective layer 54 and the upper portions of dielectric spacers 59 are then etched so that protective layer 54 is removed, and upper portions of dielectric spacers 59 are removed between spacer gates 57 and conductive layers 53. This leaves a gap between conductive layers 53 and spacer gates 57.

In a further step, conductive material such as polysilicon is deposited to provide connective conductive portions 77. Connective conductive portions 77 fill the gap formed during the removal of protective layer 54 and portions of dielectric spacers 59, and couple or electrically connect spacer gates 57 to conductive layers 53. An n-type doping step is then done to dope connective conductive portions 77, and to provide dopant for source regions 33. In an exemplary embodiment, an arsenic implant dose of $3.0 \times 10^{15}$ atoms/cm$^2$ with an implant energy of 80 KeV is used for this doping step. In one embodiment, a first anneal step is used at this point to activate and diffuse the various dopants to form body region 31, doped regions 23 and source region 33. By way of example, device 10 is exposed to a temperature of about 1030 degrees Celsius for about 45 seconds. In alternative embodiment, the dopants are activated and diffused at a later step as described below.

Figure 9:
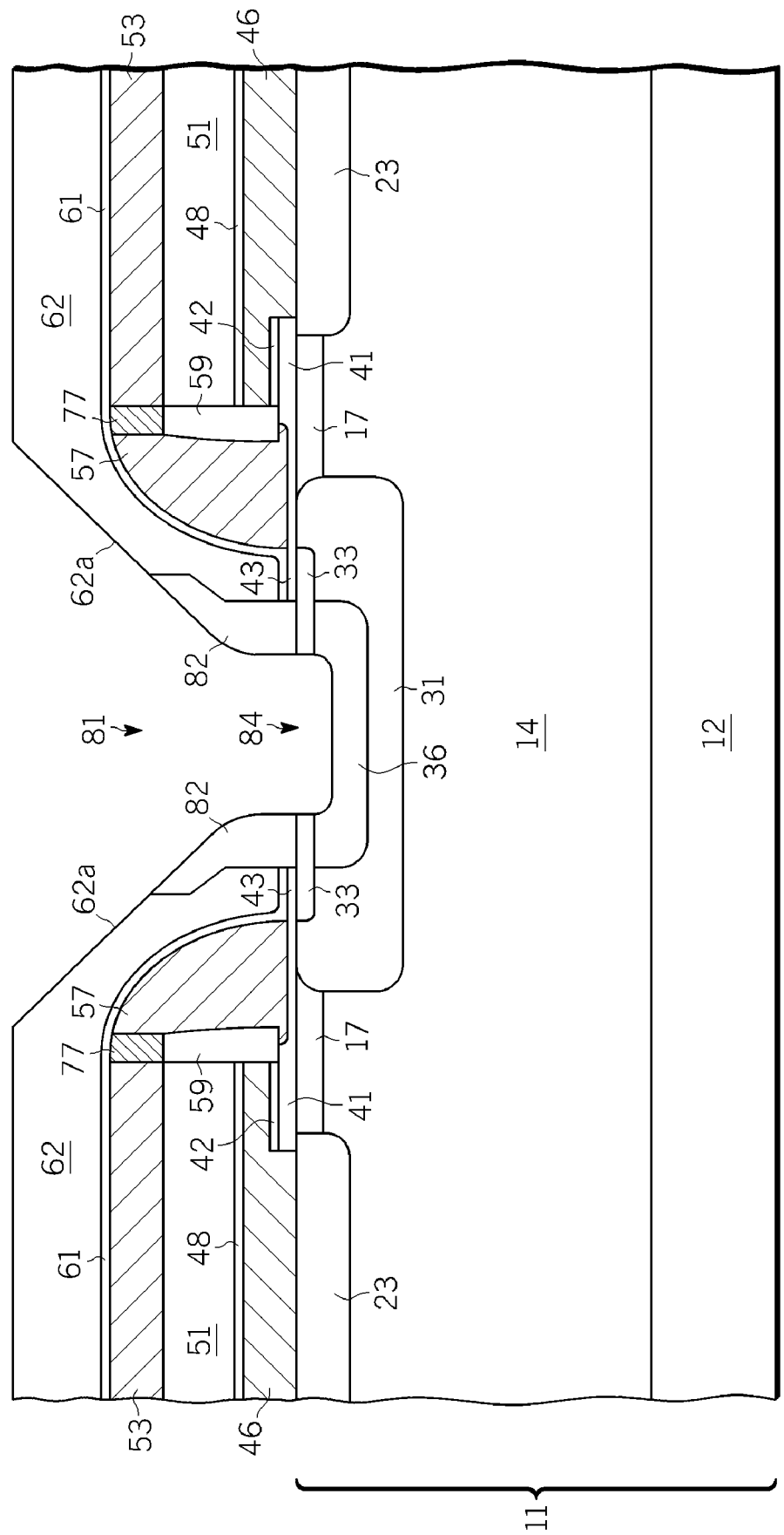
FIG. 9 illustrates a highly enlarged partial cross-sectional view of an embodiment of the present invention at a still further stage of fabrication.

FIG. 9 shows an enlarged partial cross-sectional view of device 10 after further steps in fabrication. Fifth dielectric layer 61 is deposited, and comprises for example, about 0.05 microns of silicon nitride. ILD layer 62 is then deposited over fifth dielectric layer 61. In an exemplary embodiment, ILD layer 62 comprises a deposited silicon oxide about 0.8 microns in thickness. An optional ILD taper etch is used to taper portions 62a of ILD layer 62, which helps with step coverage for subsequently formed layers.

Next, a conventional photolithographic and etch step is used to form contact opening 81, which exposes a portion of major surface 18. Contact region 36 is then formed through opening 81 using a p-type ion implantation step. By way of example, a boron ion implant dose of $3.0 \times 10^{14}$ atoms/cm$^2$ and an implant energy of 80 KeV is used. A conformal spacer layer is then deposited and etched to form spacers 82. In an exemplary embodiment, a 0.3 micron layer of silicon nitride is deposited and etched to form spacers 82. In one embodiment, a rapid anneal step is used at this point to activate and diffuse the various ion implants. For example, device 10 is exposed to a temperature of about 1030 degrees Celsius for about 45 seconds.

An etch step is then used to remove a portion of major surface 18 to form recessed portion 84. This allows source contact layer 63 to contact both source regions 33 and contact region 36, which shorts these regions together. Spacers 82 are then removed. In subsequent processing, source contact layer 63 is deposited and patterned. Substrate 12 is then optionally thinned, and drain contact layer 66 is deposited to provide the structure shown in FIG. 1. It is further understood that other conductive layers such as silicide layers may be formed before depositing source contact layer 63.

In view of all the above, it is evident that a novel device and methods of its manufacture are disclosed. Included, among other features, is a semiconductor device with counter-doped regions formed in portions of the device. Among other things, the counter-doped regions improve breakdown voltage performance without impacting output current performance, on-state resistance, or frequency of unity current gain.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor device, comprising:
   a semiconductor substrate;
   a semiconductor layer of a first conductivity type formed over the semiconductor substrate and having a major surface;
   a body region of a second conductivity type disposed in the semiconductor layer for forming a channel of the semiconductor device;
   a current conducting region of the first conductivity type formed in the body region;
   a gate structure formed adjacent the channel;
   a first doped region of the second conductivity type formed in the semiconductor layer in proximity to a drain edge of the channel to enhance breakdown voltage of the semiconductor device when in operation, wherein the first doped region is spaced apart from the body region so that a portion of the semiconductor layer is between the body region and the first doped region in proximity to the major surface;
   a first conductive layer coupled to the first doped region;
   a second doped region of the first conductivity type formed between the body region and the first doped region, wherein the second doped region has a higher dopant concentration than the semiconductor layer.

2. The semiconductor device of claim 1 further comprising a pedestal structure formed over the major surface, and wherein the gate structure includes a control electrode formed along a side surface of the pedestal structure.

3. The semiconductor device of claim 2 wherein the control electrode is extended over the pedestal structure to receive an external signal ($V_G$).

4. The semiconductor device of claim 1 wherein the semiconductor substrate comprises the second conductivity type.

5. The semiconductor device of claim 1, wherein the first doped region and the current conducting region are biased at the same potential ($V_S$) when the semiconductor device is in operation.

6. The semiconductor device of claim 1, wherein the first doped region is spaced a distance in a range from about 0.5 microns to about 3.0 microns from the body region.

7. The semiconductor device of claim 1, wherein the substrate comprises the first conductivity type.

8. The semiconductor device of claim 1, wherein the semiconductor layer comprises silicon-germanium.

9. The semiconductor device of claim 1, wherein the semiconductor layer comprises silicon-germanium-carbon.

10. The semiconductor device of claim 1, wherein the semiconductor device comprises a plurality of body regions to form a cellular design.

11. The semiconductor device of claim 1, wherein the semiconductor device comprises a single body region to form a single body design.

12. An IGFET device comprising:
a semiconductor substrate;
a semiconductor layer of a first conductivity type formed overlying the semiconductor substrate and having a major surface;
a body region of a second conductivity type disposed in the semiconductor layer for forming a channel of the IGFET device;
a source region of the first conductivity type formed in the body region;
a gate structure comprising a gate dielectric layer and a conductive gate region formed adjacent the body region and source region for controlling the channel;
a first doped region of the second conductivity type formed in the semiconductor layer in proximity to a drain edge of the channel when in operation, wherein the first doped region is spaced apart from the body region so that a portion of the semiconductor layer is between the body region and the first doped region in proximity to the major surface; and
a first conductive layer electrically coupled to the first doped region a second doped region of the first conductivity type formed between the body region and the first doped region, wherein the second doped region has a higher dopant concentration than the semiconductor layer.

13. The IGFET device of claim 12, wherein the first doped region and the source region are biased at the same potential ($V_S$) when the IGFET device is in operation.

14. The IGFET device of claim 12, wherein the first doped region is spaced a distance in a range from about 0.5 microns to about 3.0 microns from the body region.

15. A semiconductor device comprising:
a semiconductor substrate;
a semiconductor layer of a first conductivity type formed overlying the semiconductor substrate and having a major surface;
a body region of a second conductivity type disposed in the semiconductor layer for forming a channel of the IGFET device;
a source region of the first conductivity type formed in the body region;
a gate structure comprising a gate dielectric layer and a conductive gate region formed adjacent the body region and source region for controlling the channel;
a first doped region of the second conductivity type formed in the semiconductor layer in proximity to a drain edge of the channel when in operation, wherein the first doped region is spaced apart from the body region so that a portion of the semiconductor layer is between the body region and the first doped region in proximity to the major surface;
a second doped region of the first conductivity type formed between the body region and the first doped region, wherein the second doped region has a higher dopant concentration than the semiconductor layer; and
a first conductive layer electrically coupled to the first doped region.

16. The semiconductor device of claim 15 wherein the semiconductor substrate comprises the second conductivity type.

17. The semiconductor device of claim 15, wherein the first doped region and the source region are biased at the same potential ($V_S$) when the semiconductor device is in operation.

18. The semiconductor device of claim 15, wherein the first doped region is spaced a distance in a range from about 0.5 microns to about 3.0 microns from the body region.

* * * * *